United States Patent [19]

Maeda et al.

[11] Patent Number: 5,386,193
[45] Date of Patent: * Jan. 31, 1995

[54] PARTIAL DISCHARGE DETECTING DEVICE FOR RESIN-MOLDED TRANSFORMER

[75] Inventors: Takao Maeda; Tatsuo Nishizawa; Kenji Watanabe, all of Kawasaki, Japan

[73] Assignee: Fuji Electric Co., Ltd., Kanagawa, Japan

[*] Notice: The portion of the term of this patent subsequent to Aug. 3, 2010 has been disclaimed.

[21] Appl. No.: 63,575

[22] Filed: May 19, 1993

Related U.S. Application Data

[63] Continuation-in-part of Ser. No. 824,540, Jan. 23, 1992, Pat. No. 5,233,305.

[30] Foreign Application Priority Data

Feb. 15, 1991 [JP] Japan .................. 3-021219
May 20, 1992 [JP] Japan .................. 4-126525

[51] Int. Cl.6 ............................................. G01R 31/06
[52] U.S. Cl. ............................ 324/547; 324/536
[58] Field of Search .............. 324/455, 536, 546, 547, 324/713, 718

[56] References Cited

U.S. PATENT DOCUMENTS

| | | | |
|---|---|---|---|
| 3,501,694 | 3/1970 | Ito ........................ | 324/713 X |
| 3,775,676 | 11/1973 | Harrold et al. .......... | 324/547 X |
| 4,245,187 | 1/1981 | Wagner et al. ......... | 324/547 X |
| 4,710,705 | 12/1987 | Kawabata ............... | 324/102 |
| 5,159,319 | 10/1992 | Dunk et al. ............ | 324/547 X |
| 5,233,305 | 8/1993 | Nishizawa et al. ..... | 324/547 |

FOREIGN PATENT DOCUMENTS 3-216564 9/1991 Japan .
4-259864 9/1992 Japan .

OTHER PUBLICATIONS

"The Research of a Method of Partial Discharge Detecting Device For Resin-Molded Transformer", Tatsuo Nishizawa et al., Electric Power and Energy Department of the Electrical Conference, pp. 552-553, Jul. 23, 1992.

*Primary Examiner*—Kenneth A. Wieder
*Assistant Examiner*—Glenn W. Brown
*Attorney, Agent, or Firm*—Finnegan, Henderson, Farabow, Garrett & Dunner

[57] ABSTRACT

A partial discharge detecting device for a resin-molded transformer having no-load switching tap terminals on a high voltage winding thereof. An amplifier amplifies the output detection signal of a partial discharge detecting sensor connected between the tap terminals, and an electro-optic converter converts the output signal of the amplifier into an optical signal. The optical signal is applied through an optical fiber to an opto-electric converter where it is converted into an electrical signal. The electrical signal is applied to an indicator. The partial discharge detecting sensor, the amplifier circuit, and the electro-optic converter are held at a potential corresponding to a potential of the tap terminals.

5 Claims, 5 Drawing Sheets

PARTIAL DISCHARGE DETECTING DEVICE FOR RESIN-MOLDED TRANSFORMER

CROSS REFERENCE TO RELATED APPLICATION

This application is a continuation-in-part of U.S. patent application Ser. No. 07/824,540 filed on Jan. 23, 1992, now U.S. Pat. No. 5,233,305 the content of which is relied upon and incorporated by reference.

BACKGROUND OF THE INVENTION

1. Field of the invention

This invention relates to a preventive maintenance device for a resin-molded transformer which is extensively employed for reception of high voltages and, more particularly, to a partial discharge detecting device for detecting, with high accuracy, partial electric discharges which are induced in a primary winding of a high voltage side of a transformer.

2. Description of the Related Art

Figure 8:
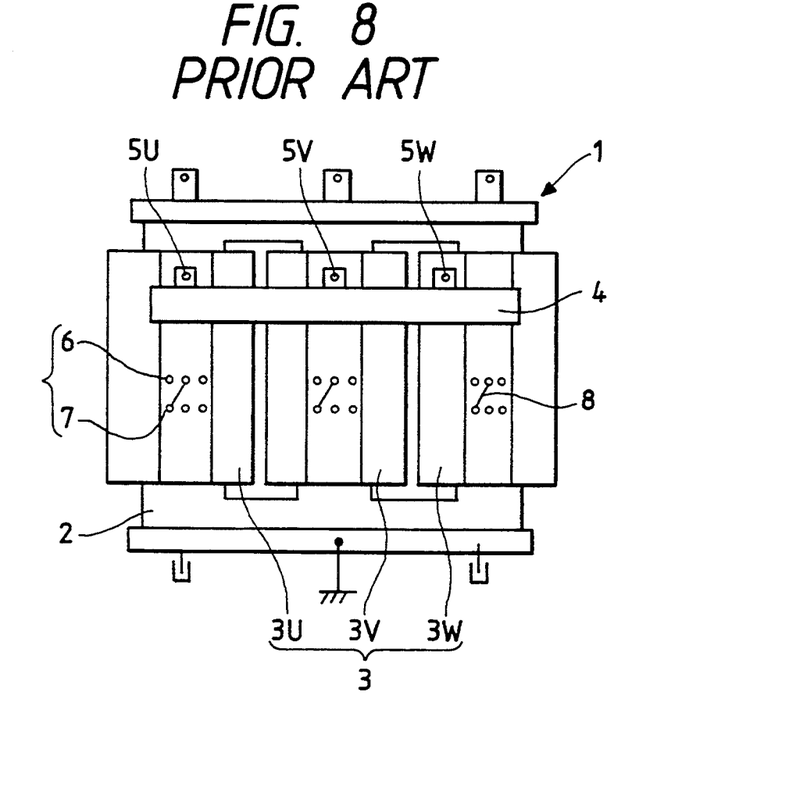
FIG. 8 is a front view of a conventional resin-molded transformer.
Figure 9:
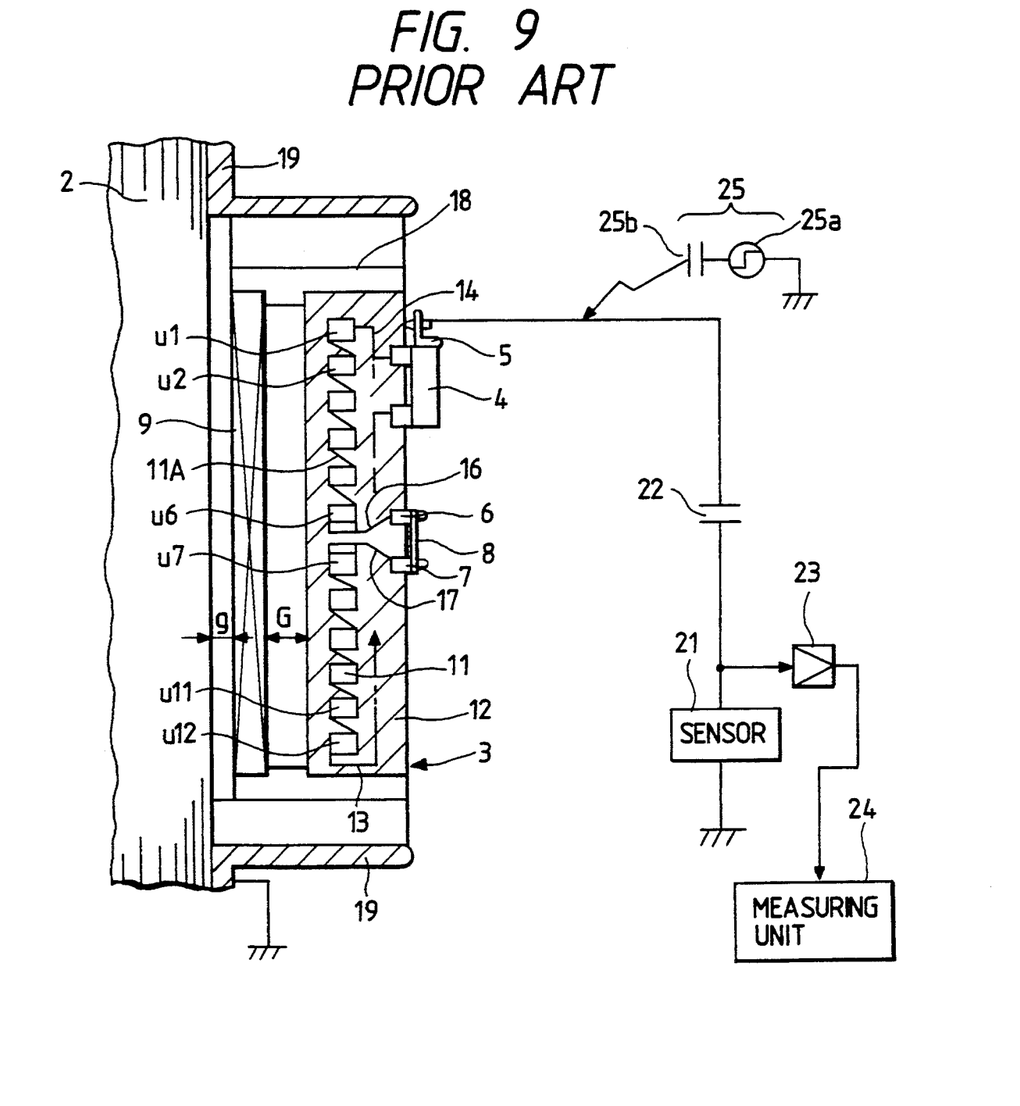
FIG. 9 is a schematic diagram showing a conventional partial discharge detecting device connected to a resin-molded transformer.

FIG. 8 is a front view showing one example of a conventional three-phase resin-molded transformer, and FIG. 9 is a fragmentary cross section of the transformer of FIG. 8 with an explanatory diagram showing a conventional partial discharge detecting circuit together with a resin-molded winding. The three-phase resin-molded transformer 1 comprises a high voltage winding assembly 3 including U-phase, V-phase and W-phase high voltage windings 3U, 3V and 3W (hereinafter referred to as "high voltage windings 3" or "windings 3", when applicable), respectively, which are wound on a three-leg iron core 2, and low voltage windings 9 wound inside the high voltage windings 3. The windings 3 and 9 are held through insulators 18 between a pair of frames 19 such that the windings 3 and 9 are coaxially held with a main insulation gap length G therebetween, and such that a gap length g is provided between each of the low voltage windings 9 and the iron core 2.

The high voltage windings 3 are formed as follows. In each of the high voltage windings 3, a plurality of unit coils 11, each formed by lap-winding a foil conductor having a predetermined width, are stacked axially at predetermined intervals, and are then series-connected to one another with bridging lead wires 11A. The unit coils 11 thus connected are molded with or potted in epoxy resin 12. Both ends of the high voltage winding are connected through buried lead wires 13 and 14 to a buried fitting, so that the windings are three-phase-connected with a resin-molded interphase connection leader 4 having high voltage terminals 5U, 5V and 5W. Of the unit coils u1 through u12, the unit coils u6 and u7 have taps which are connected through buried tap lead wires 16 and 17 to buried tap terminal units 6 and 7, respectively. Each of the tap terminal units 6 and 7 comprises a plurality of tap terminals. A connecting conductor 8 is provided for a pair of tap terminal units 6 and 7, so as to selectively connect one of the tap terminals of the tap terminal unit 6 to one of the tap terminals of the tap terminal unit 7. That is, the high voltage windings 3 are tapped such that the winding ratio of the primary and secondary windings can be changed while under a zero load.

In the resin-molded transformer thus constructed, partial electric discharges can be measured as follows. As shown in FIG. 9, the high voltage terminal 5 is connected through a coupling capacitor 22 to a partial discharge detecting sensor 21, so that a discharge pulse in the charging current of the coupling capacitor 22 is detected as a voltage pulse or current pulse with the sensor 21. The detected pulse is amplified by an amplifier 23 to a predetermined level. The output of the amplifier 23 is applied to a measuring unit 24, so that the magnitude (or the amount of discharge) of the pulse and the frequency of occurrence of the pulse are measured. In order to detect the voltage pulse, the sensor 21 may comprise an impedance detecting element, such as a resistor, electrostatic capacitive element, or inductive element. In order to detect the current pulse, the sensor 21 may comprise a high frequency current transformer. The measuring unit 24 may comprise a waveform observing device with an amplifier, such as an oscilloscope or a partial discharge measuring device. The partial discharge detecting sensitivity is calibrated with a calibrating pulse generator 25 comprising a rectangular pulse generator 25a in series with a capacitor 25b. The calibrating pulse generator 25 is connected between the high voltage terminal 5 and ground, and supplies a known discharge pulse to the high voltage terminal 5. The magnitude of the supplied pulse is measured with the measuring unit 24 to detect the amount of discharge. (cf., Electric Society, Standard Investigation Association Standard, JEC-204, for instance).

The high voltage windings 3 of the resin-molded transformer are molded as follows. The series circuits of the unit coils 11 and the buried lead wires 13, 14, 16 and 17 are molded with epoxy resin by vacuum or pressure impregnation so that no voids are formed in the resultant molding. The molding is thermally set to form a resin mold layer 12 containing the unit 11 coils and the buried lead wires 13, 14, 16 and 17. That is, the high voltage windings are sufficiently insulated to the extent that no partial discharges are induced by the operating voltage (hereinafter referred to as a "corona free" condition, when applicable). Accordingly, when testing for detecting whether or not a "corona free" condition is obtained, the partial discharge detecting sensitivity should be as high as possible. However, in general, the detecting sensitivity is set to 50 pico coulombs (PC) to eliminate the effects of external noise.

The partial discharges induced by exciting the high voltage windings 3 are roughly divided into an external corona in the surrounding air when the surface of the resin mold layer 12 is contaminated, for instance, with moisture or salt, and an internal partial discharge (hereinafter referred to as "a void corona", when applicable) inside the resin mold layer 12. The high voltage windings 3 are surrounded by a large air gap (such as the main insulation gap G) and, therefore, the electric field in the resin mold layer 12 is generally low. Further, the probability is low that the void corona will spread towards a grounded component as the external corona. The buried tap lead wires 16 and 17 are laid between the tap coils u6 and u7 and, therefore, the resin mold layer 12 may include a portion where the insulation distance between the buried lead wires and the tap coils is locally short. A shared voltage corresponding to one unit coil is applied to this portion. Hence, if there are bubbles, or the like, in the portion, then a void corona is formed therein. In addition, the resin mold layer includes a portion where the lead wires 13 and 14 are extended along the plurality of unit coils 11 to the inter-phase connection leader 4. The sum of shared voltages corresponding to the plurality of unit coils 11 is applied to this portion, so that void coronas are liable to take place between the unit coils 11. If void coronas take place in this portion, they may break the insulation and possibly short circuit the unit coils through the lead wires. Hence, in the resin-molded transformer with no-load switching taps, it is essential for the partial discharge detecting device to positively detect the void discharges which are induced near the tapped coils located near the middle of the winding.

The conventional partial discharge detecting device in which the sensor 21 is connected through the coupling capacitor 22 between the high voltage terminal of the high voltage windings 3 and ground can positively detect the external corona which is induced to spread from the surface of the resin mold layer towards the components at ground potential, such as the iron core and the low voltage windings. However, in the case where the void corona is induced between the unit coils and the buried lead wires, a pulse circuit is formed to allow the discharge pulse thereof to circulate through a small number of unit coils. In this case, the discharge pulse is small and returns to the sensor 21 through the small stray capacitance which the non-grounded high voltage windings 3 form with ground. Accordingly, the conventional partial discharge detecting device has a low detection sensitivity. Furthermore, because the device is adversely affected by external noise, it is rather difficult to detect the void corona.

SUMMARY OF THE INVENTION

Accordingly, an object of this invention is to eliminate the above-described difficulties associated with a conventional partial discharge detecting device.

More specifically, an object of the invention is to provide a partial discharge detecting device which is capable of detecting void coronas with high accuracy which are liable to take place as the shared voltages between the buried lead wires and the unit coils are locally increased.

Additional features and advantages of the invention will be set forth in the description which follows, and in part will be apparent from the description, or may be learned by practice of the invention. The objects and other advantages of the invention will be realized and attained by the apparatus particularly pointed out in the written description and claims hereof as well the appended drawings.

To achieve these and other advantages and in accordance with the purposes of the invention, as embodied and broadly described, a partial discharge detecting device for a resin-molded transformer having no-load switching tap terminals on a high voltage winding thereof, the tap terminals having a potential with respect to ground, is provided. The partial discharge detecting device comprises a partial discharge detecting sensor connected between the tap terminals for providing a partial discharge detection signal and an amplifier for amplifying the partial discharge detection signal. An electro-optic converter converts the amplified partial discharge detection signal into an optical signal and an optical fiber transmits the optical signal from the electro-optic converter. An opto-electric converter converts the optical signal transmitted by the optical fiber into an electrical signal and applies the electrical signal to an indicator. The partial discharge detecting sensor, the amplifier circuit, and the electro-optic converter are held at a potential corresponding to the potential of the tap terminals.

In one aspect of the invention, the tap terminals are connected by a connecting conductor, the connecting conductor is integrally formed with the partial discharge detecting sensor, the amplifier is integrally formed with the electro-optic converter, and an output terminal of the partial discharge detecting sensor and an input terminal of the amplifier are provided as a plug and a receptacle, respectively, to thereby form a connector.

In another aspect of the invention, the amplifier and the electro-optic converter are coupled to the resin-molded transformer by engagement of the plug with the receptacle, and the partial discharge detecting sensor is covered with a connecting conductor.

Since the partial discharge detecting device of the present invention is held at a high potential, the detecting device together with the tap coils of the transformer can form a pulse circuit. Hence, the void coronas formed near the tap coils can be detected with high accuracy. Furthermore, even a discharge pulse produced in a portion of the transformer which is distant from the tap coils can be detected with a detection sensitivity which is not much lower than in the conventional detecting method because part of the discharge pulse is applied to the detecting circuit. In addition, by providing an optical transmitting path on the output side of the amplifier circuit, the indicator can be arranged on the ground potential side. Hence, the signal can be transmitted to the indicator which is located at a distant position without being affected by external noise.

Further, in the partial discharge detecting device of the present invention, the tap terminals are connected with a connecting conductor, the connecting conductor is integral with the partial discharge detecting sensor, and the amplifier is integral with the electro-optic converter. In addition, the output terminal of the partial discharge detecting sensor and the input terminal of the amplifier are provided as the plug and receptacle of a connector. With this structure, partial discharge measurements can be started merely by engaging the plug with the receptacle without removal of the connecting conductor.

Still further, in the partial discharge detecting device of the present invention, the assembly of the amplifier and electro-optic converter is supported on the resin-molded transformer by engaging the plug with the receptacle. Hence, it is unnecessary to provide an insulating stand when measuring partial discharges, and the number of measuring jigs can be decreased. In addition, the partial discharge detecting sensor is covered with the connecting conductor. That is, the sensor is not exposed outside the resin-molded transformer. Therefore, the transformer is maintained fine in external appearance during operation.

BRIEF DESCRIPTION OF THE DRAWINGS

The accompanying drawings, which are incorporated in and constitute a part of the specification, illustrate several embodiments of the invention and, together with the general description given above and the detailed description of the embodiments given below, serve to explain the principles of the invention. In the drawings.

DETAILED DESCRIPTION OF THE PREFERRED EMBODIMENTS

Reference will now be made in detail to present preferred embodiments of the invention, examples of which are illustrated in the accompanying drawings.

First Embodiment

A first embodiment will be described with reference to FIG. 1, in which parts corresponding to those which have been described with reference to FIGS. 8 and 9 are designated by the same-reference numerals and/or characters.

Figure 1:
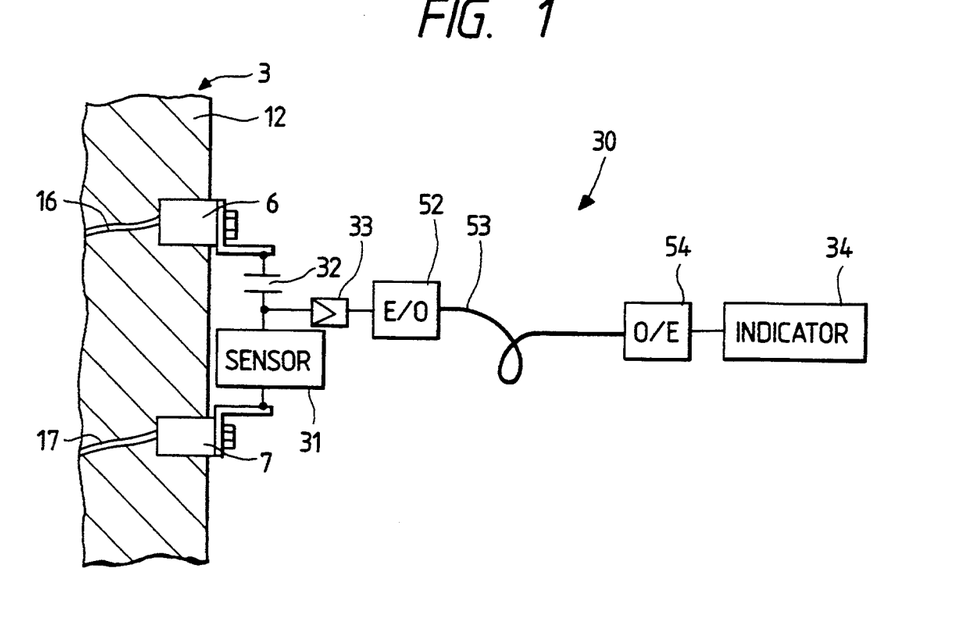
FIG. 1 is a schematic diagram showing a partial discharge detecting device according to a first embodiment of the invention.

A partial discharge detecting device 30, as shown in FIG. 1, comprises a series circuit including a coupling capacitor 32 and a partial discharge detecting sensor 31 between tap terminals 6 and 7, and an amplifier circuit 33 for amplifying a pulse signal detected by the sensor 31, the amplifier circuit 33 being connected to a junction between the capacitor 32 and the sensor 31. The capacitor 32, the sensor 31, and the amplifier 33 are held at a high potential. The amplifier 33 is connected to an electro-optic (E/O) converter 52 which is adapted to convert the output signal of the amplifier 33 into an optical signal. The optical signal is applied through an optical fiber 53 to an opto-electric (O/E) converter 54. That is, a discharge pulse detected by sensor 31 is transmitted through the optical fiber 53 to the ground potential side, amplified by the amplifier circuit 33, and converted into an electrical signal by the O/E converter 54. The magnitude of the detected discharge pulse is displayed on an indicator 34. The sensor 31 may comprise, for example, an impedance detecting element or a high frequency current transformer.

Second Embodiment

Figure 2:
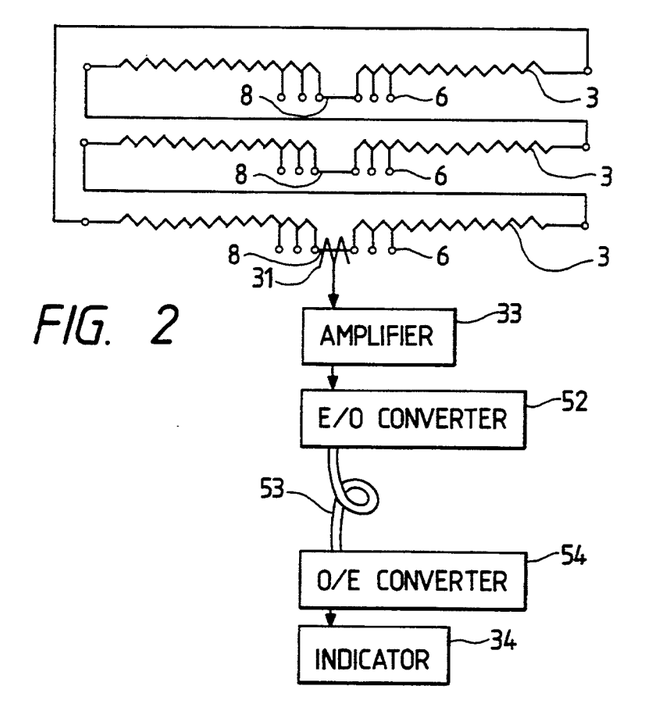
FIG. 2 is a schematic diagram showing a partial discharge detecting device according to a second embodiment of the invention.

A second embodiment of the invention will be described with reference to FIG. 2. As shown in FIG. 2, a partial discharge is detected using a connecting conductor 8 which connects tap terminals 6. More specifically, the partial discharge is detected with a partial discharge measuring device comprising a partial discharge sensor 31, an amplifier 33, an E/O converter 52, an optical fiber 53, an O/E converter 54, and an indicator 34.

The partial discharge sensor 31 comprises a through type high frequency current transformer, through which the connecting conductor 8 extends. The secondary output of the sensor 31 is amplified by the amplifier 33, and the output signal of the amplifier 33 is converted into an optical signal by the E/O converter 52. The optical signal from the E/O converter 52 is applied through the optical fiber 53 to the O/E converter 54 where it is converted into an electrical signal, which is then applied to the indicator 34. The indicator 34 comprises a meter and an oscilloscope for displaying the magnitude and of the frequency of the detected partial discharge.

With the partial discharge measuring device thus described, a partial discharge current flowing through the connecting conductor 8 can be detected and, therefore, a partial discharge in the high voltage windings 3 can be detected with high sensitivity. The partial discharge sensor 31 is sequential connected to each of the three-phase high voltage windings 3, so that a total of three partial discharge measurements are made.

Third Embodiment

Figure 3:
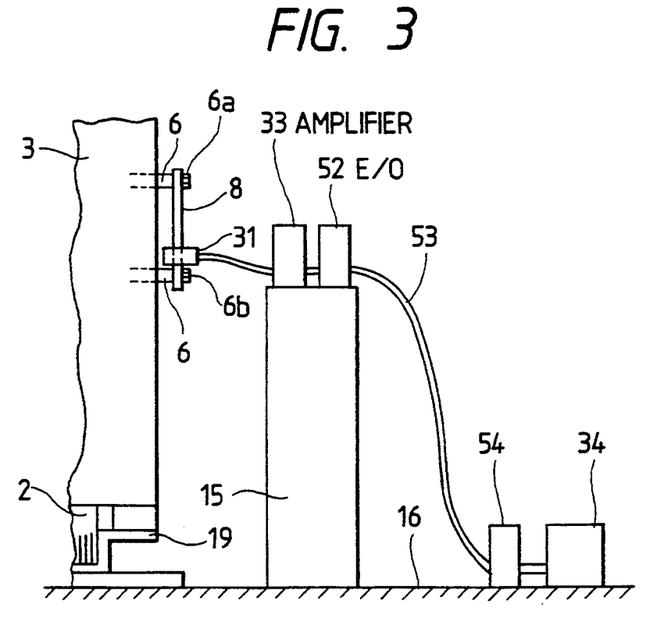
FIG. 3 is a schematic diagram showing essential components of a partial discharge detecting device according to a third embodiment of the invention.

A third embodiment of the invention will be described with reference to FIG. 3. As shown in FIG. 3, a connecting conductor 8 is fixedly connected via bolts 6a and 6b between tap terminals 6 disposed on high voltage windings 3 of a resin-molded transformer such that the connecting conductor 8 penetrates a partial discharge sensor 31. The output of the sensor 31 is amplified by an amplifier 33, and the output of the amplifier 33 is converted to an optical signal by an E/O converter 52. The amplifier 33 and the E/O converter 52 are situated on an insulating stand 15. The optical signal from the E/O converter 52 is applied through an optical fiber 53 to an O/E converter 54, situated on the ground 16, where it is converted to an electrical signal. The electrical signal from the O/E converter 54 is supplied to an indicator 34.

The amplifier 33 and the E/O converter are set on the insulating stand 15 so that the amplifier 33 and the E/O converter 52 are at a high potential as are the tap terminals 6. The amplifier 33 and the E/O converter 52 are battery operated.

Fourth Embodiment

Figure 4:
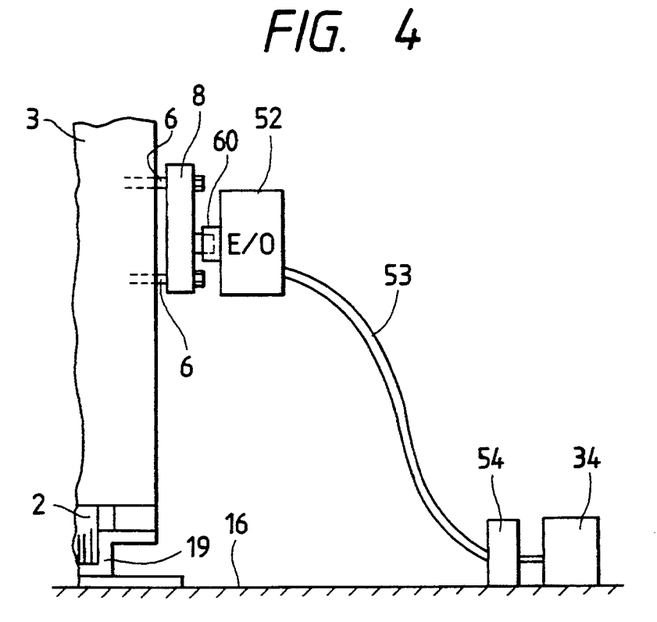
FIG. 4 is a schematic diagram showing essential components of a partial discharge detecting device according to fourth embodiment of the invention.

A fourth embodiment of the invention will be described with reference to FIG. 4. As shown in FIG. 4, a connecting conductor 8 incorporating a partial discharge sensor (not shown) is connected between tap terminals 6. An E/O converter 52 incorporating an amplifier (not shown) at its input side is fixedly supported on the side of high voltage windings 3 through a connector 60.

Figure 5:
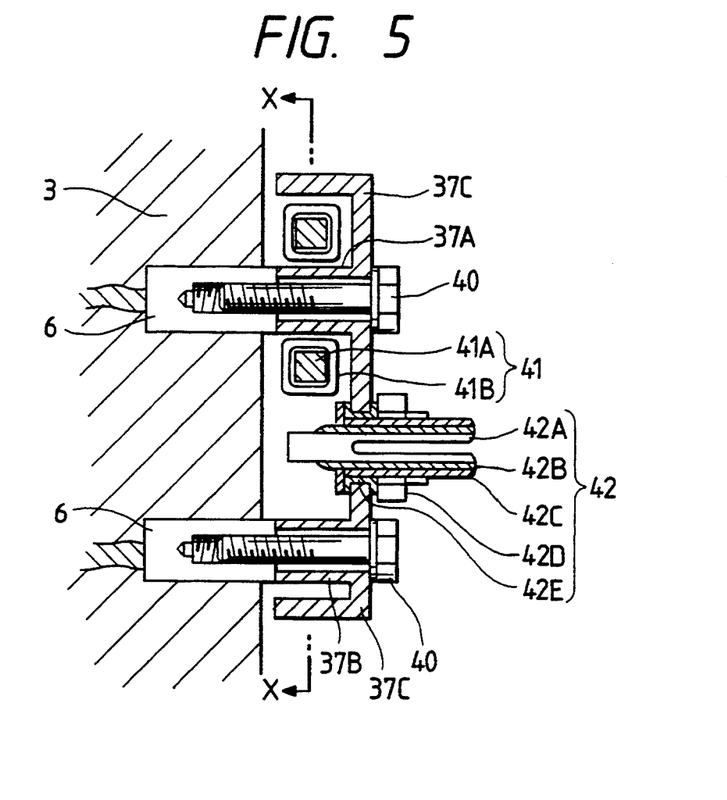
FIGS. 5 and 6 are an enlarged sectional view and a sectional side view, respectively, showing a connecting conductor of FIG. 4.
Figure 6:
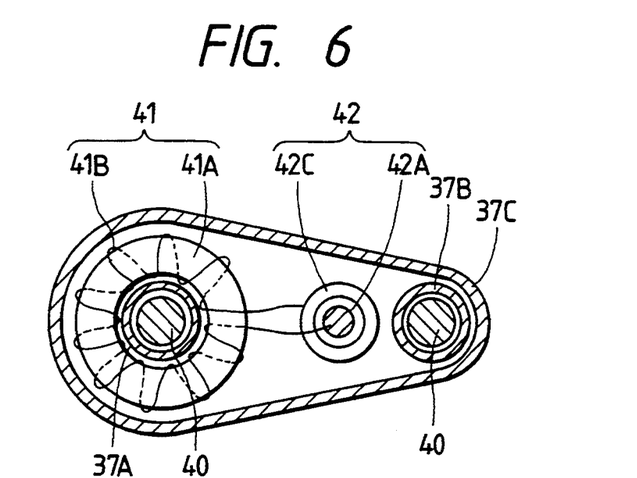

FIG. 5 is an enlarged sectional view of the connecting conductor 8 of FIG. 4, and FIG. 6 is a sectional view taken along line X—X of FIG. 5. As shown in FIG. 5, the connecting conductor 8 comprises two cylindrical protrusions 37A and 37B which are engaged with the tap terminals 6, and a coupling portion 37C which is integral with the cylindrical protrusions 37A and 37B. The connecting conductor 8 is secured to the tap terminals 6 with bolts 40 inserted into the cylindrical protrusions 37A and 37B. The connecting conductor 8 further comprises a partial discharge sensor 41 through a supporting insulator (not shown). The partial discharge sensor 41 includes a toroidal ferrite core 41A which surrounds the cylindrical protrusion 37A, and a secondary winding 41B wound on the toroidal ferrite core 41A. The connecting conductor 8 further comprises a receptacle 42, which includes an internal conductor 42A having an engaging hole along a Central axis, and an external conductor 42C provided around the internal conductor 42A through an insulator 42B. The outer cylindrical surface of the external conductor 42C is threaded, and a nut 42D is engaged with the threaded surface of the external conductor 42C to secure the external conductor 42C to the connecting conductor 8 through a U-shaped insulating ring 42E. The terminals of the secondary winding 41B are connected to the internal conductor 42A and the external conductor 42C. Thus, the secondary winding 41B is electrically insulated from the connecting conductor 8.

As shown in FIG. 6, the coupling portion 37C of the connecting conductor 8 incorporating the partial discharge sensor 41 is elliptic. Current flows from one of the tap terminals 6 of the high voltage winding to another through the cylindrical protrusion 37A, the coupling portion 37C and the cylindrical protrusion 37B of the coupling conductor 8. That is, current flows through the cylindrical protrusion 37A which is extended along the central axis of the ferrite core 41A. Hence, if a partial discharge occurs within the high voltage windings 3, an electrical signal is induced in the secondary winding 41B, and applied to the internal conductor 42A and the external conductor 42C in the receptacle 42.

Figure 7:
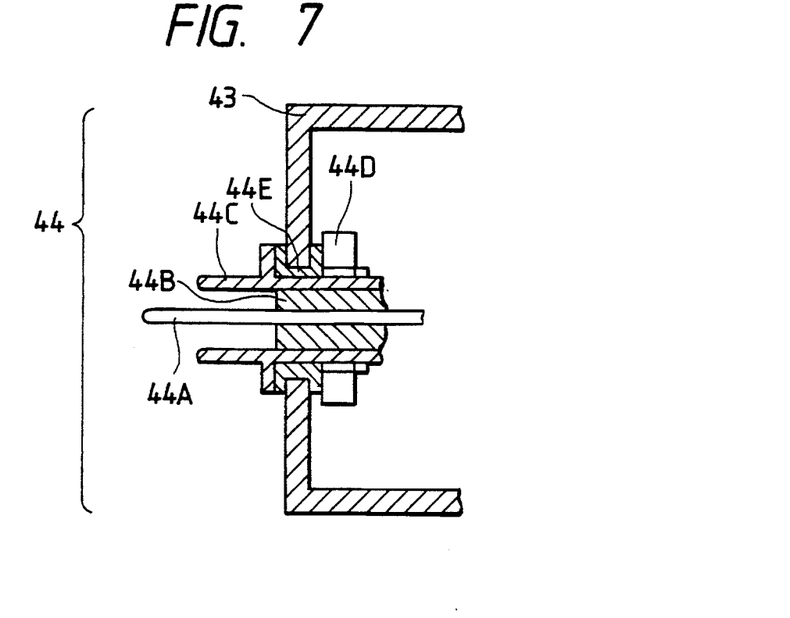
FIG. 7 is an enlarged sectional view showing essential components of an E/O converter of FIG. 4.

FIG. 7 is an enlarged sectional view showing an arrangement of the E/O converter 52 of FIG. 4. The E/O converter 52 comprises an amplifier (not shown), an E/O converter section (not shown), and a battery (not shown) built in a casing 43. The casing 43 has an opening through which a plug 44 is fitted. The plug 44 includes a needle-like internal conductor 44A, and an external conductor 44C surrounding the internal conductor 44A through an insulator 44B. The external conductor 44C has a threaded outer cylindrical surface, and a nut 44D is engaged with the threaded surface of the external conductor 44C to secure the external conductor 44C to the casing 43 through a U-shaped insulating ring 44E. Therefore, the internal conductor 44A and the external conductor 44C are connected to the amplifier (not shown) such that they are insulated from the casing 43. The plug 44 of FIG. 7 is engageable with the receptacle 42 of FIG. 5. That is, when the plug 44 and the receptacle 42 are engaged with each other, the connector 60 of FIG. 4 is formed and the E/O converter 52 is secured to the side of the high voltage windings 3.

With the connector 60 formed in the above-described manner, the internal conductor 44A of the plug 44 of FIG. 7 is fitted into the engaging hole of the internal conductor 42A of the receptacle 42 of FIG. 5, while the external conductor 42C of the receptacle 42 is inserted into the external conductor 44C of the plug 44. Hence, the E/O converter 52 can be manually connected to or disconnected from the connecting conductor 8. If the E/O converter 52 is removed, the resin-molded transformer can be operated with the connecting conductor 8 held connected to the nigh voltage windings 3.

When securing the E/O converter 52 to the side of the high voltage windings 3 with the connector 60 as shown in FIG. 4, it is desirable that the E/O converter 52 be as compact and light as possible. Hence, the casing 43 of the E/O converter 42 may be made of a light weight ABS (Acrylonitrile-Butadien-Styrene) resin, or the like. If the casing 43 is made of an insulating material, the insulating ring 44E of the plug 44 of FIG. 7 may be eliminated.

It is not always necessary to locate the partial discharge sensor 41 inside the connector conductor 8 as shown in FIG. 5. Rather, it is only necessary that the partial discharge sensor 41 extend through the connecting conductor 8 while being secured to the connecting conductor 8, and have the receptacle 42 to output the partial discharge detection signal. However, when the partial discharge sensor 41 is covered with the connecting portion 37C of the connecting conductor 8 as shown in FIG. 5, the sensor 41 is not exposed outside and, therefore, the resin-molded transformer is maintained fine in external appearance during operation.

SUMMARY

As described above, in the partial discharge detecting device according to the present invention, the partial discharge detecting sensor is provided between the no-load switching taps of the high voltage windings of the resin-molded transformer. A discharge pulse detected by the sensor is amplified and applied through an optical transmission circuit to an indicator where the magnitude of the discharge pulse is displayed. Therefore, when compared with the conventional detecting device in which a coupling capacitor and a detecting sensor are connected between a high voltage terminal and ground, the detecting device of the present invention can detect, with high sensitivity, a void corona in the resin molded coils which is liable to be produced as the electric field between the unit coils and the buried lead wires increase locally in strength. That is, the detecting device of the present invention can detect void coronas which are equal to or less than 50 PC with a high S/N ratio, the detection of which is essential for resin-molded transformers. By combining the detecting device with an optical fiber transmission path, the detected pulse can be monitored at a distance without being adversely affected by external noise, and the internal partial discharges in the resin-molded transformer can be monitored in an on-line mode.

Furthermore, in the present invention, the partial discharge sensor is integral with the connecting conductor, and the amplifier is integral with the E/O converter. The output terminal of the partial discharge sensor and the input terminal of the amplifier are provided as the plug and receptacle of the connector, so that they can be freely engaged with or disengaged from each other. Hence, partial discharge measurements can be initiated by merely connecting the plug and the receptacle, thereby making it unnecessary to remove the connecting conductor. This means that the preparatory time for making partial discharge measurements can be decreased. Further, with the present invention, difficulties in sufficiently connecting the conductor to the tap terminals and connecting the conductor to the correct tap terminals can be eliminated.

In addition, the assembly of the amplifier and the O/E converter in the present invention is secured to the resin-molded transformer merely by engagement of the plug-in type connector. Hence, it is unnecessary to use the insulating stand when making partial discharge measurements and, therefore, the number of measuring jigs can be decreased.

Moreover, the partial discharge sensor of the present invention is covered with a connecting conductor and is, therefore, not exposed outside the resin-molded transformer. Thus, the transformer is maintained fine in external appearance during operation.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. A partial discharge detecting device for a resin-molded transformer having no-load switching tap terminals on a high voltage winding thereof, the tap terminals having a potential with respect to ground, comprising:
    a partial discharge detecting sensor connected between the tap terminals for providing a partial discharge detection signal;
    an amplifier for amplifying the partial discharge detection signal;
    an electro-optic converter for converting the amplified partial discharge detection signal into an optical signal;
    an optical fiber for transmitting the optical signal from the electro-optic converter; and
    an opto-electric converter for converting the optical signal transmitted by the optical fiber into an electrical signal and for applying the electrical signal to an indicator,
    the partial discharge detecting sensor, the amplifier circuit, and the electro-optic converter being held at a potential corresponding to the potential of the tap terminals.

2. The device as claimed in claim 1, wherein said partial discharge detecting sensor comprises a high frequency current transformer connected between said tap terminals through a coupling capacitor.

3. The partial discharge detecting device of claim 1, wherein:
    the tap terminals are connected by a connecting conductor;
    the connecting conductor is integrally formed with the partial discharge detecting sensor;
    the amplifier is integrally formed with the electro-optic converter; and
    an output terminal of the partial discharge detecting sensor and an input terminal of the amplifier are provided as a plug and a receptacle, respectively, to thereby form a connector.

4. The partial discharge detecting device of claim 3, wherein the amplifier and the electro-optic converter are coupled to the resin-molded transformer by engagement of the plug with the receptacle.

5. The partial discharge measuring device as claimed in any one of claims 1-4, wherein the partial discharge detecting sensor is covered with a connecting conductor.

* * * * *